United States Patent
Buess et al.

Patent Number: 6,104,190
Date of Patent: Aug. 15, 2000

[54] NUCLEAR QUADRUPOLE RESONANCE (NQR) METHOD AND APPARATUS FOR DETECTING A NITRAMINE EXPLOSIVE

[75] Inventors: Michael L. Buess, Alexandria, Va.; Allen N. Garroway, Fort Washington, Md.

[73] Assignee: The United States of America as represented by the Secretary of the Navy, Washington, D.C.

[21] Appl. No.: 09/193,234

[22] Filed: Nov. 17, 1998

[51] Int. Cl.[7] .................................................. G01V 3/00
[52] U.S. Cl. ............................................ 324/300; 324/307
[58] Field of Search .................................. 324/300, 301, 324/311, 312, 314, 307, 309

[56] References Cited

U.S. PATENT DOCUMENTS

| | | | |
|---|---|---|---|
| 4,887,034 | 12/1989 | Smith | 324/307 |
| 5,159,617 | 10/1992 | King et al. | 378/57 |
| 5,206,592 | 4/1993 | Buess et al. | 324/307 |
| 5,233,300 | 8/1993 | Buess et al. | 324/307 |
| 5,254,950 | 10/1993 | Fan et al. | 324/322 |
| 5,365,171 | 11/1994 | Buess et al. | 324/307 |
| 5,457,385 | 10/1995 | Sydney et al. | 324/301 |
| 5,491,414 | 2/1996 | Smith et al. | 324/307 |
| 5,500,591 | 3/1996 | Smith et al. | 324/307 |
| 5,583,437 | 12/1996 | Smith et al. | 324/300 |
| 5,592,083 | 1/1997 | Magnuson et al. | 324/300 |
| 5,594,338 | 1/1997 | Magnuson | 324/318 |
| 5,608,321 | 3/1997 | Garroway et al. | 324/307 |
| 5,814,987 | 9/1998 | Smith et al. | 324/300 |
| 5,814,989 | 9/1998 | Smith et al. | 324/300 |

Primary Examiner—Louis Arana
Attorney, Agent, or Firm—Barry A. Edelberg; John J. Karasek

[57] ABSTRACT

A Nuclear Quadrupole Resonance (NQR) method and apparatus for detecting the presence of a nitramine explosive, with a reduced probability of spurious triggering of consumer electronics. In the method and apparatus, a signal is emitted towards a nitramine explosive so that a nitro group in the nitramine explosive produces an NQR resonance signal. The NQR resonance signal is then detected to thereby detect the presence of the nitramine explosive. If the nitramine explosive is RDX, the NQR resonance signal of the nitro group is at a frequency which is either 502.3 kHz, 500.5 kHz, 405.1 kHz, 396.2 kHz or 384.1 kHz. Such frequencies are much lower than those in conventional detection techniques. As a result, the probability of the undesirable spurious triggering of electronic items exposed to the NQR RF pulses will be reduced, due to the reduction in induced voltage at lower frequency. The detection sensitivity is also reduced, but in many cases will still be adequate to detect nitramine explosives.

17 Claims, 1 Drawing Sheet

NUCLEAR QUADRUPOLE RESONANCE (NQR) METHOD AND APPARATUS FOR DETECTING A NITRAMINE EXPLOSIVE

BACKGROUND OF THE INVENTION

1. Field of the Invention

The present invention relates to a Nuclear Quadrupole Resonance (NQR) method and apparatus for detecting a nitramine explosive. More specifically, the present invention relates to an NQR method and apparatus for detecting a nitramine explosive by detecting an NQR resonance signal produced by a nitro group of the explosive.

2. Description of the Related Art

There are many situations where it is desirable to detect the presence of a specific substance. For example, with the unfortunate increase in drug trafficking and terrorist use of high explosives in aircraft and buildings, there is a strong interest for a reliable detection system that can detect sub-kilogram quantities of narcotics and explosives against a background of more benign materials in a rapid, accurate, and non-invasive fashion.

Nuclear quadrupole resonance (NQR) is a known technique for detecting the presence of specific substances. More specifically, various substances produce an NQR resonance signal when excited by radio frequency (RF) radiation at a particular frequency. Generally, RF radiation at a particular frequency will cause a precession in nuclei of a specific substance, but not in other substances. Nuclear quadrupole resonance (NQR) takes advantage of this phenomenon to detect the various substances.

FIG. 1 is a diagram illustrating the overall hardware architecture of a conventional NQR apparatus. As illustrated in FIG. 1, a transmitter 20 and a receiver 22 are connected to a probe 24 through a transmit/receive (T/R) switch 26. To detect the presence of a specific substance, T/R switch 26 connects transmitter 20 to probe 24 while disconnecting receiver 22 from probe 24. Then, transmitter 20 generates a pulse train and supplies the pulse train to probe 24. Generally, the pulse train is formed by a signal having a frequency corresponding to the resonance frequency of the nuclei of the specific substance which is intended to be detected. Probe 24 receives the pulse train, and emits a corresponding signal towards a target specimen (not illustrated). If the specific substance desired to be detected is present in the target specimen, the signal emitted from probe 24 will cause the substance to produce an NQR resonance signal.

After the signal is emitted by probe 24, T/R switch 26 connects receiver 22 to probe 24 while disconnecting transmitter 20 from probe 24. Probe 24 then detects the NQR resonance signal produced by the specific substance, and probe 24 produces a corresponding output signal. The output signal of probe 24 is received and analyzed by receiver 22, to confirm the presence of the specific substance in the target specimen.

NQR detection has been used, for example, to detect nitramine explosives, such as RDX, HMX and tetryl.

Unfortunately, electronic items exposed to NQR detection, such as those in a suitcase or package undergoing inspection, may spuriously trigger. For example, a consumer electronic item such as a camera may initiate the flash or advance the film when exposed to NQR detection. It would be desirable to reduce the number of occurrences of such spurious triggering, especially in the detection of nitramine explosives.

SUMMARY OF THE INVENTION

Accordingly, it is an object of the present invention to provide an NQR method and apparatus for detecting a nitramine explosive, such as RDX, while reducing the potential for spurious triggering of electronic items exposed to the detection.

Additional objects and advantages of the invention will be set forth in part in the description which follows, and, in part, will be obvious from the description, or may be learned by practice of the invention.

The foregoing objects of the present invention are achieved by providing a method and apparatus for detecting a nitramine explosive. In the method and apparatus, a signal is emitted towards a nitramine explosive so that a nitro group in the nitramine explosive produces a Nuclear Quadrupole Resonance (NQR) resonance signal. The NQR resonance signal is then detected, to thereby detect the presence of the nitramine explosive. If the nitramine explosive is RDX, the NQR resonance signal of the nitro group is at a frequency which is either 502.3 kHz, 500.5 kHz, 405.1 kHz, 396.2 kHz or 384.1 kHz at room temperature (skilled practitioners will recognize that the frequency of identified NQR peaks vary with temperature; the frequencies recited herein are for the purpose of identifying these peaks, and it is to be understood that detection conducted above or below room temperature will still identify these peaks despite their frequency shift, and that such detection is within the scope of the invention disclosed and claimed herein).

The present invention will permit reducing the induced voltage to reduce the risk of spurious excitation.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
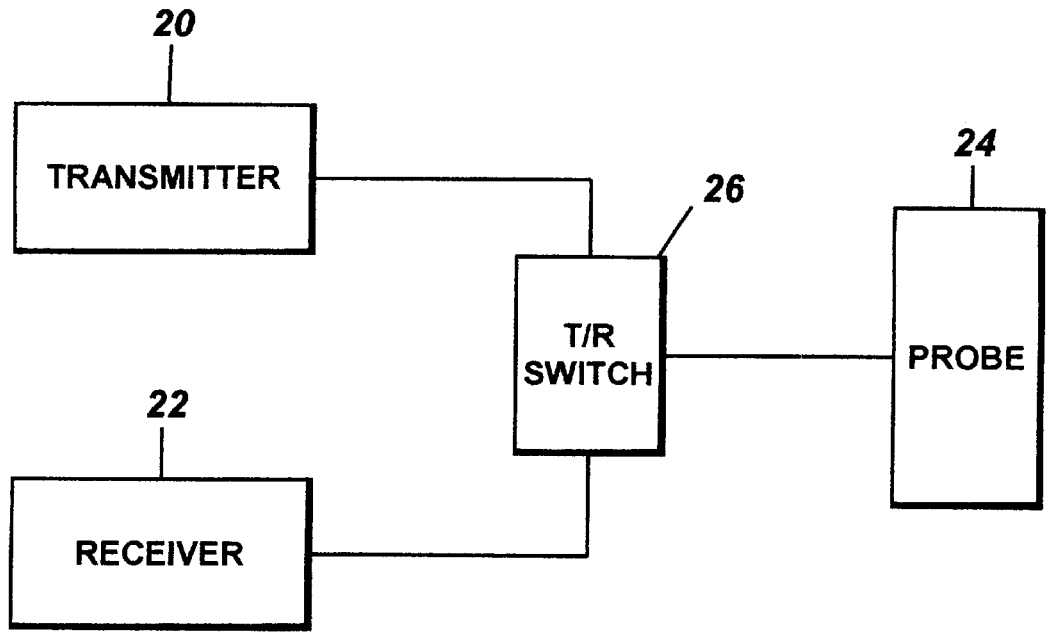
FIG. 1 (prior art) is a diagram illustrating the overall hardware architecture of a conventional NQR apparatus.

Reference will now be made in detail to the present preferred embodiments of the present invention, examples of which are illustrated in the accompanying drawings, wherein like reference numerals refer to like elements throughout.

As described above, NQR has been used to detect nitramine explosives, such as RDX, HMX and tetryl. A characteristic of nitramine explosives is that they contain nitrogen in both amino and nitro sites, and the $^{14}N$ NQR spectra of these two sites are quite different. More specifically, the amino nitrogens have much higher NQR frequencies.

In NQR, generally, higher frequencies are easier to detect. As a result, conventionally, emphasis in the NQR detection of nitramine explosives is placed on the amino nitrogens because their high NQR frequencies improve detectability. Therefore, conventionally, to detect a nitramine explosive, a signal is emitted towards a nitramine explosive which causes the amino group in the explosive to produce an NQR resonance signal. This NQR resonance signal is then detected, to detect the presence of the explosive.

Such NQR detection of the nitramine explosive RDX, which is a military explosive, is particularly successful because of the favorable $^{14}$N NQR characteristics of its amino nitrogens. Indeed, the NQR detectability of nitramine explosives is, in general, considerably higher than that of explosives containing only nitro groups.

Moreover, as described above, electronic items exposed to NQR detection, such as those in a suitcase or package undergoing inspection, may spuriously trigger. This effect is caused by voltages induced by the radio frequency (RF) pulses used for NQR detection, and is more severe at higher detection frequencies, as the induced voltages are directly proportion to the frequency of the RF pulses.

Therefore, the higher frequencies of the amino nitrogens in nitramine explosives improves detection sensitivity, but also incurs a greater risk of incidental triggering of electronic items contained in a sample, such as a piece of luggage, under inspection. For example, the higher detection frequency of the nitramine explosive RDX improves the detection sensitivity, but also results in a greater risk that electronic items exposed to the detection will be triggered.

The amino nitrogen spectra of nitramine explosives typically contains several amino nitrogen spectra lines with frequencies ranging from 1.5 MHz to 5.3 MHz, and, conventionally, the line with the frequency that changes the least with temperature is generally chosen for detection purposes.

However, according to embodiments of the present invention, in order to reduce the likelihood of spurious triggering of electronic items exposed to the NQR detection, a better choice would be the amino nitrogen spectra line with the lowest frequency. For example, in RDX, the 3.41 MHz line near the center of the amino spectrum is conventionally detected because of its low temperature coefficient. However, a degenerate pair of amino lines exists at 1.78 MHz, and the risk of electronic triggering would be reduced by nearly half with less than a 50% reduction in the already high RDX detectability if this pair of low frequency lines were instead detected.

Further, according to embodiments of the present invention, electronic triggering could be avoided to an even greater extent by detecting the spectra lines of the nitro groups below one MHz.

Figure 2:
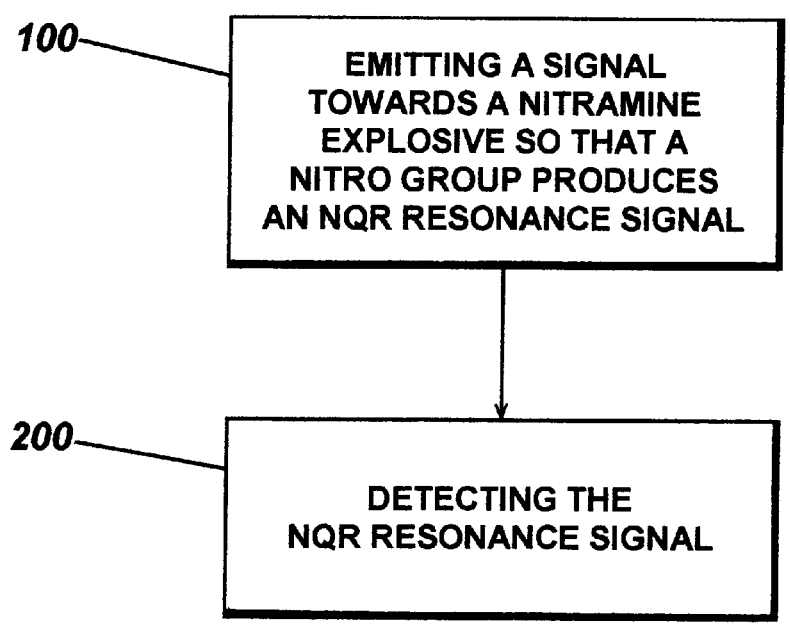
FIG. 2 is a diagram illustrating an NQR detection process, according to an embodiment of the present invention.

For example, FIG. 2 is a diagram illustrating an NQR detection process, according to an embodiment of the present invention. Referring now to FIG. 2, in step 100, a signal is emitted towards a nitramine explosive so that a nitro group in the nitramine explosive produces an NQR resonance signal.

From step 100, the process moves to step 200, where the NQR resonance signal is detected, to thereby detect the presence of the nitramine explosive.

Therefore, the process in FIG. 2 emits a signal towards a nitramine explosive which causes the nitro group in the explosive to produce an NQR resonance signal. This is significantly different than a conventional process in which a signal is emitted towards a nitramine explosive which causes the amino group in the explosive to produce an NQR resonance signal.

Regarding RDX, the NQR frequencies in the nitro groups in RDX were previously unknown. However, the Applicants have discovered five of the six possible nitro-$^{14}$N resonances in RDX at room temperature at the frequencies of 502.3 kHz, 500.5 kHz, 405.1 kHz, 396.2 kHz and 384.1 kHz, respectively. The Applicants have also found that the NQR relaxation times of these spectra lines are very similar to those of its amino nitrogen spectra lines. Because the efficiency of an NQR detection pulse sequence is determined by those relaxation times, a steady-state free-precession (SSFP) pulse sequence which is the most efficient at detecting the amino nitrogen spectra lines of RDX also works well with the nitro nitrogen spectra lines.

Therefore, according to embodiments of the present invention, to detect RDX, in step 100 of FIG. 2, a signal is emitted towards the RDX so that a nitro group in the RDX produces an NQR resonance signal which is at a frequency of 502.3 kHz, 500.5 kHz, 405.1 kHz, 396.2 kHz or 384.1 kHz. In step 200 of FIG. 2, the NQR resonance signal can then be detected to thereby detect the presence of the RDX.

Particular attention should be paid to the two nitro nitrogen spectra lines of RDX near 500 kHz, that is, the spectra lines at 500.5 kHz and 502.3 kHz. With these nitro nitrogen spectra lines, the steady-state free-precession (SSFP) signal intensities are the same (as a fraction of their equilibrium magnetization) as that of the 3.41 MHz spectra line normally used for RDX detection. Furthermore, the 500.5 kHz and 502.3 kHz spectra lines are close enough that both are accessible during the same detection scan.

The NQR resonance signal at 500.5 kHz and the NQR resonance signal at 502.3 kHz are so close together that they can be easily detected during the same scan. However, the present invention is not intended to be limited to detecting some type of "combined" signal. Instead, these two NQR resonance signals could be separately detected.

Detecting both the NQR resonance signals at 500.5 kHz and 502.3 kHz typically improves the signal-to-noise ratio by a factor of $2^{1/2}$. This improvement in signal-to-noise ratio compensates somewhat for the reduction of sensitivity due to the much lower detection frequency.

Moreover, for the same amount of RDX and inspection time, the signal-to-noise ratio at approximately 500 kHz will be only $\frac{1}{10}$ of that at 3.41 MHz. However, RDX detectability at 3.41 MHz is quite high so that a factor of ten reduction still provides adequate detection capability in many circumstances. On the other hand, a factor of seven reduction in detection frequency is expected to reduce significantly the potential for incidental damage (such as spurious triggering) to electronic items contained in a sample, such as a piece of luggage, under inspection.

The $^{14}$N NQR spectra of the nitro groups of nitramine explosives other than RDX, such as tetryl and HMX should be much lower than those of the amino groups by which those explosives are currently detected, and would typically be in the range of 200 to 1000 kHz. Therefore, the detection of these other nitramine explosives may also benefit by making use of their lower frequency nitro NQR spectra lines.

As a result, the above embodiments of the present invention are applicable to the detection of other types of nitramine explosives, such as tetryl and HMX, by emitting a signal towards the nitramine explosive so that a nitro group in the nitramine explosive produces an NQR resonance signal in the range of 200 to 1000 kHz. This NQR resonance signal can then be detected to detect the presence of the nitramine explosive.

For these other nitro NQR spectra lines, for example, either a SSFP sequence a spin lock spin echo (SLSE) sequence, or stochastic excitation (see U.S. Pat. No. 5,608, 321) could be employed. These sequences can be optimized for detection of the nitro NQR spectra lines, based, for example, on the NQR relaxation parameters. The use and optimization of SSFP and SLSE sequences in NQR is known.

As indicated above, in NQR detection of RDX, a signal is emitted towards the RDX so that a nitro group in the RDX produces an NQR resonance signal having a frequency of 502.3 kHz, 500.5 kHz, 405.1 kHz, 396.2 kHz or 384.1 kHz. Generally, these are frequencies at substantially room temperature, which is typically defined as approximately 22° C. The exact frequency of the NQR resonance signal to be detected should be adjusted in accordance with a temperature coefficient to compensate for variations in temperature from room temperature. A typical temperature coefficient is expected to be on the order of approximately 100 Hz/° C. A temperature coefficient can be positive or negative, based on the particular target material. The determination of an appropriate temperature coefficient for a particular target material would be understandable by a person of skill in the art.

The above embodiments of the present invention are applicable to the detection of nitramine explosives, such as RDX, HMX, and tetryl. RDX, HMX and tetryl are known substances, and typically refer to as following substances:

RDX=hexahydro-1,3,5-trinitro-1,3,5-triazine
HMX=octahydro-1,3,5,7-tetranitro-1,3,5,7-tetrazocine
tetryl=N, methyl-N,2,4,6-tetranitrobenzamine The above embodiments of the present invention can be implemented by an overall hardware configuration similar to that, for example, in FIG. 1. However, the specific embodiment of the transmitter and receiver would be designed to implement the present invention.

For example, according to embodiments of the present invention, a transmitter emits a signal towards a nitramine explosive so that a nitro group in the nitramine explosive produces an NQR resonance signal. A detector (such as, for example, a receiver) detects the NQR resonance signal to thereby detect the presence of the nitramine explosive.

An NQR transmitter, such as transmitter 20 in FIG. 1, typically generates a pulse train to emit an appropriate signal towards a target material so that the target material produces an NQR resonance signal. Depending on the specific NQR application and the specific target material, there are many different types of pulse trains which can be used in NQR. Such use of pulse trains is known. However, the present invention is not intended to be limited to the use of a "pulse train" to emit a signal towards a target material, and it may be possible to generate and provide a different type of signal to the probe.

Of course, there are many different overall hardware configurations of a NQR apparatus. For example, FIG. 1 illustrates a single probe which is shared by a transmitter and a receiver. Instead, separate transmit and receive systems can be used. In this case, the transmitter could have its own dedicated probe, and the receiver could have its own dedicated probe. Further, there are many known configurations for a transmitter, receiver and a probe.

Specific NQR techniques are disclosed, for example, in U.S. Pat. No. 5,206,592, issued Apr. 27, 1993, to Buess, et al. for DETECTION OF EXPLOSIVES BY NUCLEAR QUADRUPOLE RESONANCE; U.S. Pat. No. 5,233,300, issued Aug. 3, 1993, to Buess, et al. for DETECTION OF EXPLOSIVES AND NARCOTICS BY LOW POWER LARGE SAMPLE VOLUME NUCLEAR QUADRUPOLE RESONANCE; and U.S. Pat. No. 5,365,171, issued Nov. 15, 1994, for REMOVING THE EFFECTS OF ACOUSTIC RINGING AND REDUCING TEMPERATURE EFFECTS IN THE DETECTION OF EXPLOSIVES BY NQR; and U.S. Pat. No. 5,608,321, issued Mar. 4, 1997 for METHOD AND APPARATUS FOR DETECTING TARGET SPECIES HAVING QUADRUPOLAR NUCLEI BY STOCHASTIC NUCLEAR QUADRUPOLE RESONANCE, each of which is incorporated by reference herein, in its entirety, for all purposes.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method comprising:

emitting a signal towards a nitramine explosive so that a nitro group in the nitramine explosive produces a Nuclear Quadrupole Resonance (NQR) resonance signal; and detecting the NQR resonance signal to thereby detect the presence of the nitramine explosive.

2. A method as in claim 1, wherein the nitramine explosive is RDX.

3. A method as in claim 2, wherein the NQR resonance signal is at a frequency which is one of the group consisting of 502.3 kHz, 500.5 kHz, 405.1 kHz, 396.2 kHz and 384.1 kHz measured at room temperature.

4. A method as in claim 1, wherein the nitramine explosive is one of the group consisting of RDX, HMX and tetryl.

5. A method as in claim 1, wherein the nitramine explosive is RDX and the signal emitted towards the RDX causes the RDX to produce first and second NQR resonance signals at 500.5 kHz and 502.3 kHz, respectively, and said detecting detects the first and second NQR resonance signals to thereby detect the presence of the RDX.

6. A method as in claim 1, wherein the nitramine explosive is RDX and the signal emitted towards the RDX causes the RDX to produce first and second NQR resonance signals at 500.5 kHz and 502.3 kHz, respectively, at room temperature, adjusted in accordance with a temperature coefficient to compensate for variations in temperature from room temperature, and said detecting detects the first and second NQR resonance signals to thereby detect the presence of the RDX.

7. A method as in claim 4, wherein the NQR resonance signal is at a frequency within the range of 200 to 1000 kHz.

8. An apparatus comprising:

a transmitter emitting a signal towards a nitramine explosive so that a nitro group in the nitramine explosive produces a Nuclear Quadrupole Resonance (NQR) resonance signal; and a detector detecting the NQR resonance signal to thereby detect the presence of the nitramine explosive.

9. An apparatus as in claim 8, wherein the nitramine explosive is RDX.

10. An apparatus as in claim 8, wherein the NQR resonance signal is at a frequency which is one of the group consisting of 502.3 kHz, 500.5 kHz, 405.1 kHz, 396.2 kHz and 384.1 kHz, measured at room temperature.

11. An apparatus as in claim 10, wherein the NQR resonance signal is at a frequency which is one of the group consisting of 502.3 kHz, 500.5 kHz, 405.1 kHz, 396.2 kHz and 384.1 kHz, at room temperature, adjusted in accordance with a temperature coefficient to compensate for variations in temperature from room temperature.

12. An apparatus as in claim 11, wherein the nitramine explosive is one of the group consisting of RDX, HMX and tetryl.

13. An apparatus as in claim 12, wherein the nitramine explosive is RDX and the signal emitted towards the RDX causes the RDX to produce first and second NQR resonance signals at 500.5 kHz and 502.3 kHz, respectively, and the detector detects the first and second NQR resonance signals to thereby detect the presence of the RDX.

14. An apparatus as in claim 12, wherein the nitramine explosive is RDX and the signal emitted towards the RDX causes the RDX to produce first and second NQR resonance signals at 500.5 kHz and 502.3 kHz, respectively, at room temperature, adjusted in accordance with a temperature coefficient to compensate for variations in temperature from room temperature, and the detector detects the first and second NQR resonance signals to thereby detect the presence of the RDX.

15. An apparatus as in claim 12, wherein the NQR resonance signal is at a frequency within the range of 200 to 1000 kHz.

16. An apparatus comprising:

means for emitting a signal towards a nitramine explosive so that a nitro group in the nitramine explosive produces a Nuclear Quadrupole Resonance (NQR) resonance signal; and means for detecting the NQR resonance signal to thereby detect the presence of the nitramine explosive.

17. An apparatus comprising:

means for emitting a signal towards an RDX target so that a nitro group in the RDX target produces a Nuclear Quadrupole Resonance (NQR) resonance signal at a frequency which is one of the group consisting of 502.3 kHz, 500.5 kHz, 405.1 kHz, 396.2 kHz and 384.1 kHz; and means for detecting the NQR resonance signal to thereby detect the presence of the RDX target.

* * * * *